United States Patent
Ogihara et al.

(10) Patent No.: US 8,216,366 B2
(45) Date of Patent: Jul. 10, 2012

(54) METHOD FOR MANUFACTURING A CUBIC SILICON CARBIDE SINGLE CRYSTAL THIN FILM AND SEMICONDUCTOR DEVICE BASED ON THE CUBIC SILICON CARBIDE SINGLE CRYSTAL THIN FILM

(75) Inventors: Mitsuhiko Ogihara, Gunma (JP); Masaaki Sakuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 158 days.

(21) Appl. No.: 12/662,637

(22) Filed: Apr. 27, 2010

(65) Prior Publication Data
US 2010/0270561 A1     Oct. 28, 2010

(30) Foreign Application Priority Data
Apr. 28, 2009  (JP) .................................. 2009-109281

(51) Int. Cl.
*C30B 23/00*     (2006.01)
*C30B 25/00*     (2006.01)
(52) U.S. Cl. .......... 117/101; 117/88; 117/951; 438/503; 438/504; 438/704; 438/745
(58) Field of Classification Search .................. 438/503, 438/504, 704, 745; 117/88, 101, 951
See application file for complete search history.

(56) References Cited

U.S. PATENT DOCUMENTS

| | | | | |
|---|---|---|---|---|
| 6,436,186 | B1 * | 8/2002 | Tanino et al. ..................... | 117/4 |
| 7,468,324 | B2 * | 12/2008 | Cheung et al. ................ | 438/706 |
| 7,601,217 | B2 * | 10/2009 | Faure et al. ..................... | 117/92 |
| 7,906,229 | B2 * | 3/2011 | Goyal ........................... | 428/698 |

FOREIGN PATENT DOCUMENTS
JP     2000-319099 A     11/2000

* cited by examiner

*Primary Examiner* — Bac Au
(74) *Attorney, Agent, or Firm* — Rabin & Berdo, P.C.

(57) ABSTRACT

A cubic silicon carbide single crystal thin film is manufactured by a method. A sacrificial layer is formed on a surface of a substrate. A cubic semiconductor layer is formed on the sacrificial layer, the cubic semiconductor layer having at least a surface of cubic crystal structure. A cubic silicon carbide single crystal layer is formed on the cubic semiconductor layer. The sacrificial layer is etched away to release a multilayer structure of the cubic semiconductor layer and the 3C—SiC layer from the substrate. A cubic silicon carbide single crystal thin film of a multilayer structure includes an $Al_xGa_{1-x}As$ $(0.6 > x \geq 0)$ layer and a cubic silicon carbide single crystal layer. A metal layer is formed on a substrate. The multilayer structure is bonded to the metal layer with the $Al_xGa_{1-x}As$ $(0.6 > x \geq 0)$ in direct contact with the metal layer.

8 Claims, 8 Drawing Sheets

Si SUBSTRATE (FIRST SUBSTRATE) 101

ZnO SINGLE CRYSTAL LAYER (OXIDE LAYER, SACRIFICIAL LAYER) 102

101

NITRIDE LAYER 103
102
101

NITRIDE LAYER 103(2)
NITRIDE LAYER 103(1)

NITRIDE LAYER 103(b)
NITRIDE LAYER 103(a)

METHOD FOR MANUFACTURING A CUBIC SILICON CARBIDE SINGLE CRYSTAL THIN FILM AND SEMICONDUCTOR DEVICE BASED ON THE CUBIC SILICON CARBIDE SINGLE CRYSTAL THIN FILM

BACKGROUND OF THE INVENTION

1. Field of the Invention

The present invention relates to a method for manufacturing a cubic silicon carbide single crystal thin film and a semiconductor device based on the cubic silicon carbide single crystal thin film.

2. Description of the Related Art

Devices formed on a silicon carbide (referred to as SiC hereinafter) substrate are known. One such device is a light emitting diode that includes an n type 6H—SiC epitaxially grown layer and a p type 6H—SiC epitaxially grown layer, both of which being formed on an n type 6H—Si substrate. Japanese Patent Application Laid-Open No. 2000-319099 discloses a device formed on an SiC substrate (e.g., 4H—Si substrate) of another crystal structure.

The SiC has a high melting point, and therefore cannot be easily re-crystallized from a melt for growing its bulk crystal. Thus, high quality bulk substrates such as Si substrates and GaAs substrates are difficult to manufacture. Also, large size SiC substrates are difficult to manufacture and are therefore extremely expensive as compared to Si substrates and GaSAs substrates.

Existing SiC devices are manufactured by forming a plurality of devices on an SiC substrate, and subsequently dicing completely through the SiC substrate into individual SiC devices. Thus, the expensive SiC substrate cannot be re-used. A need exists for a new technique effective in reducing the manufacturing cost of SiC devices.

SUMMARY OF THE INVENTION

The present invention was made to solve the aforementioned drawbacks.

An object of the invention is to provide a method for manufacturing a cubic silicon carbide (3C—SiC) single crystal thin film and a semiconductor device based on the cubic silicon carbide single crystal thin film.

Another object of the invention is to provide a low-cost cubic silicon single crystal thin film.

A cubic silicon carbide single crystal thin film is manufactured by a method. A sacrificial layer is formed on a surface of a substrate. A cubic semiconductor layer is formed on the sacrificial layer, the cubic semiconductor layer having at least a surface of cubic crystal structure. A cubic silicon carbide single crystal layer is formed on the cubic semiconductor layer. The sacrificial layer is etched away to release a multilayer structure of the cubic semiconductor layer and the 3C—SiC layer from the substrate.

A cubic silicon carbide single crystal thin film of a multilayer structure includes an $Al_xGa_{1-x}As$ ($0.6 > x \geqq 0$) layer and a cubic silicon carbide single crystal layer. A metal layer is formed on a substrate. The multilayer structure is bonded to the metal layer with the $Al_xGa_{1-x}As$ ($0.6 > x \geqq 0$) in direct contact with the metal layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

A method for manufacturing cubic silicon carbide (3C—SiC) single crystal thin film and semiconductor devices based on the 3C—SiC single crystal thin film will be described with reference to FIGS. 1-12 in terms of first to third embodiments.

The shapes and dimensions of the respective portions are shown for the sake of explanation, and do not limit the scope of the invention. Similar elements have been given the same references and their description is omitted. The invention will be described by mainly focusing on the method for manufacturing the cubic silicon carbide (3C—SiC).

First Embodiment

Figure 1A:
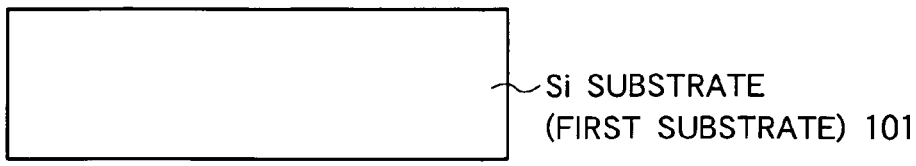
FIGS. 1A-1C illustrate a semiconductor structure including an SiC substrate, a ZnO single crystal layer, and a nitride layer.
Figure 1B:
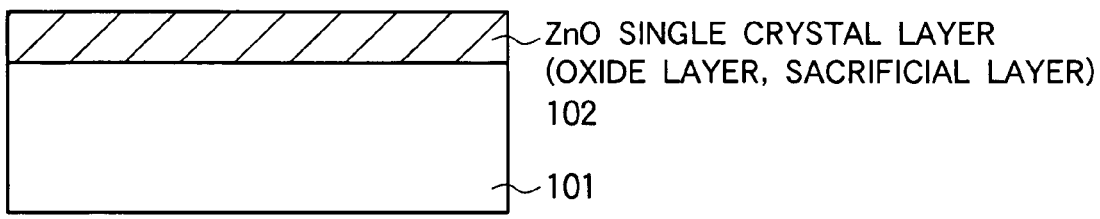
Figure 1C:
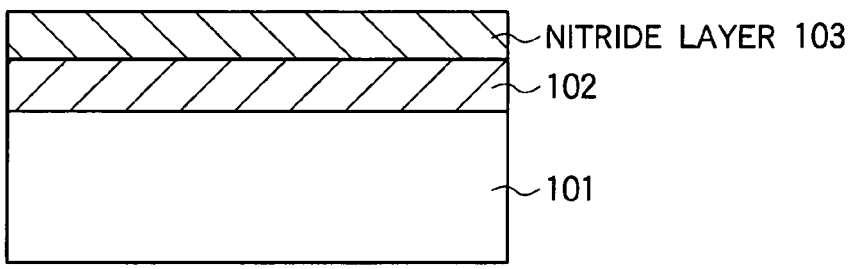

A first embodiment will be described with reference to FIGS. 1-7. FIGS. 1A-1C illustrate a semiconductor structure including an SiC substrate 101, a ZnO single crystal layer 102, and a nitride layer 103. Referring to FIG. 1A, the SiC substrate 101 is a first substrate, and is preferably an SiC substrate whose crystal structure is hexagonal crystal. In other words, the SiC substrate 101 is either a 4H—SiC substrate or a 6H—SiC substrate. "4H-" indicates a periodic structure of four-atomic layers of hexagonal crystal while "6H-" represents a periodic structure of six-atomic layers of hexagonal crystal.

Referring to FIG. 1B, an oxide layer, for example, a ZnO single crystal layer 102 is formed as a sacrificial layer on the SiC substrate 101. The ZnO single crystal layer 102 may be formed by molecular beam epitaxy (MBE) or metal organic chemical vapor deposition (MOCVD). A ZnO single crystal is a hexagonal crystal, and therefore a similar hexagonal SiC substrate may be used for the SiC substrate 101. The ZnO single crystal layer 102 may be formed on the SiC substrate 101, thereby implementing a high quality ZnO single crystal layer 102.

4H—SiC has lattice constants of a=3.073 Å and c=10.053 Å while 6H—SiC has lattice constants of a=3.080 and c=15.12 Å. ZnO has lattice constants of a=3.2496 Å and c=5.2065 Å. A hexagonal SIC substrate and a ZnO single crystal layer show only a small difference, e.g., less than 5%, in lattice constant. Thus, a hexagonal SiC substrate may be conveniently used for forming a ZnO single crystal layer, providing the ZnO single crystal layer 102 of high quality.

The ZnO single crystal layer 102 should have a thickness preferably in the range of 5-200 nm, taking a later described selective etching into consideration. A thickness smaller than 5 nm causes slow penetration of etching solution into the ZnO single crystal layer, so that the etching rate decreases or the etching process will apparently stop in the middle of the etching process. A thickness larger than 200 nm increases a surface area of the ZnO single crystal layer 102 in contact with the etching solution to decrease the reaction speed, so that the etching rate decreases or the etching process will apparently stop in the middle of the etching process.

Prolonged etching at slow etching rate may cause etched elements and reaction products to deposit, so that the selectively etched surfaces (surfaces of SiC substrate 101 and nitride layer 103 formed on the ZnO single crystal layer 102) are contaminated. Contamination of the selectively etched surface causes an increase in the surface roughness of the selectively etched surface observed under the AFM.

Next, as shown in FIG. 1C, the nitride layer 103 as a cubic crystal semiconductor layer is formed on the surface of the ZnO single crystal layer 102. The nitride layer 103 is a single crystal layer selected from the group consisting of an $Al_xGa_{1-x}N$ ($1 \geq x \geq 0$) layer, an $Al_xIn_{1-x}N$ ($1 \geq x \geq 0$) layer, and an $In_xGa_{1-x}N$ ($1 \geq x \geq 0$) layer.

Figure 2A:
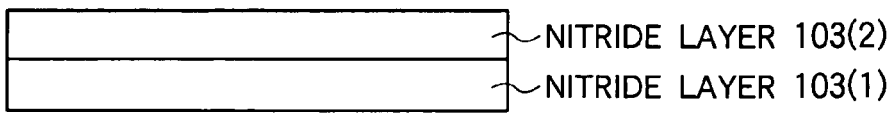
FIGS. 2A-2B illustrate the configuration of the nitride layer of the first embodiment.
Figure 2B:
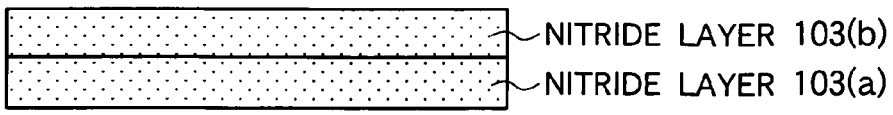

FIGS. 2A-2B illustrate the configuration of the nitride layer of the first embodiment.

Referring to FIG. 2A, the nitride layer 103 preferably includes a first nitride layer 102-1 and a second nitride layer 103-2. These layers may be formed by crystal growth, for example, MBE or MOCVD. The first nitride layer 103-1 and second nitride layer 103-2 may be formed by different crystal growing techniques. For example, the first nitride layer 103-1 may be formed by MBE using a nitrogen radical source and a Ga source while the second nitride layer 103-2 may be formed by MOCVD using ammonium (NH3) gas as a nitrogen source and trimethyl gallium (TMG) as a Ga source. The first nitride layer 103-1 may be formed at a lower temperature than the second nitride layer 103-2.

The nitride layer 103 may be a multilayer structure including a first nitride layer 103a and a second nitride layer 103b which are formed of different materials. For example, the first and second nitride layers 103a and 103b may be nitride layers selected from the group consisting of an $Al_xGa_{1-x}N$ ($1 \geq x \geq 0$) layer, an $Al_xIn_{1-x}N$ ($1 \geq x \geq 0$) layer, and an $In_xGa_{1-x}N$ ($1 \geq x \geq 0$). More specifically, the first nitride layer 103a may be an AlN layer and the second nitride layer 103b may be a GaN layer. The first nitride layer 103a may be formed at a lower temperature than the second nitride layer 103b just as in the first nitride layer 103-1 and second nitride layer 103-2.

While the aforementioned example is a dual layer structure of the first nitride layer 103a which is a single layer and the second nitride layer 103b which is a single layer. The nitride layer 103b may be a multilayer structure. For example, the nitride layer 103a may be formed of an AlN layer and the second nitride layer 103b is a multilayer including AlN layer and GaN layer (i.e., GaN/ . . . AlN/GaN).

While the nitride layer 103 has been described as being a multilayer structure including layers grown at different temperatures, the nitride layer 103 may be a single layer structure or a multilayer grown at the same temperature.

The nitride layer 103 preferably has a surface area that is brought into contact with a 3C—SiC layer in the subsequent process, at least part of the surface area being a cubic semiconductor layer of cubic (3C—) structure. The cubic GaN has a lattice constant of 4.52 Å and the cubic SiC has a lattice constant of 4.36 Å. Forming the nitride layer 103 and the SiC layer 104 which are both a cubic crystal implements the difference in lattice constant of about 3.5%, which is relatively small. For this reason, the cubic SiC layer 104 is formed on the surface of the nitride layer 103 in the first embodiment.

FIGS. 3A-3D illustrate the steps of forming an island-shaped structure and releasing the island-shaped structure from a substrate.

Figure 4A:
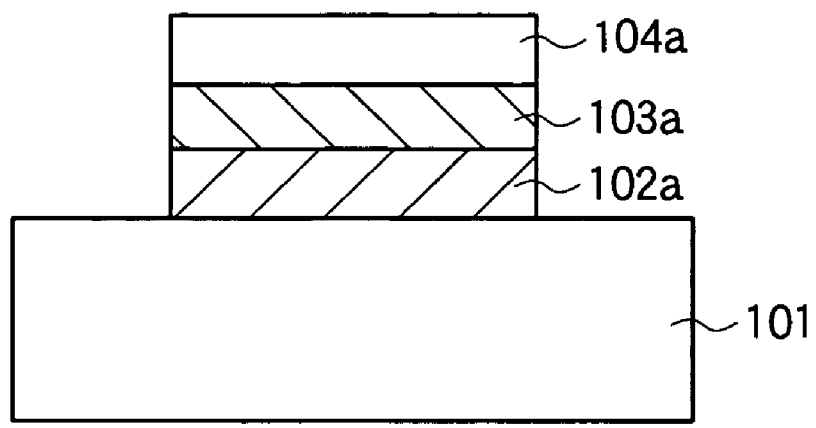
FIGS. 4A-4B illustrate another way of forming the island-shaped structure.
Figure 4B:
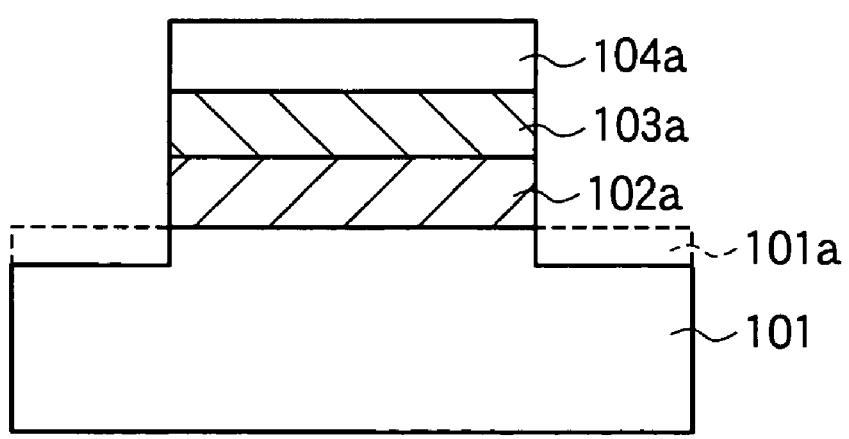

FIGS. 4A-4B illustrate another way of forming the island-shaped structure.

Figure 3A:
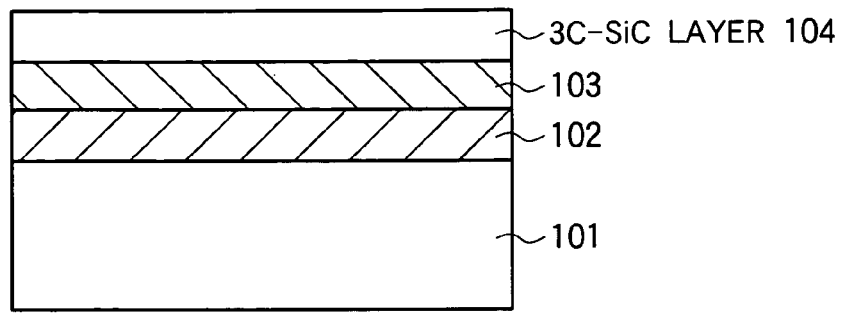
FIGS. 3A-3D illustrate the steps of forming an island-shaped structure and releasing the island-shaped structure from a substrate.

Referring to FIG. 3A, the 3C—SiC layer 104 is formed on the nitride layer 103 by, for example, plasma CVD. The 3C—SiC layer 104 is formed at a temperature equal to or lower than 1000° C., and more preferably equal to or lower than 900° C. Forming the 3C—SiC layer 104 at these temperatures minimizes the reaction at the boundary between the nitride layer 103 and the ZnO single crystal layer 102, so that the 3C—SiC layer 104 formed at this temperature is substantially free from detect.

The 3C—SiC layer 104 and the nitride layer 103 shown in FIG. 3A are then etched so that part of the ZnO single crystal layer 102 is exposed to form an island-shaped pattern (FIG. 3B) including a plurality of islands (only one of which is shown in the drawing), thereby forming a 3C—SiC layer 104a and the nitride layer 103a. Alternatively, the structure shown in FIG. 3A may be etched as shown in FIG. 4A to form an island-shaped pattern such that the island-shaped pattern includes a ZnO single crystal layer 102a, thereby forming the 3C—SiC layer 104a, the nitride layer 103a, and a ZnO single crystal layer 102a. Still alternatively, the structure shown in FIG. 3A may be etched part way into the SiC substrate 101 as shown in FIG. 4B, so that a portion 101a is etched away.

Figure 3B:
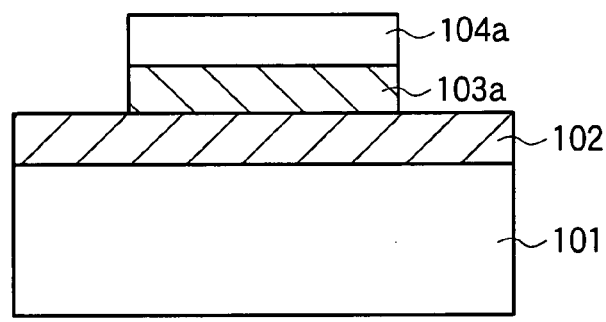
Figure 3C:
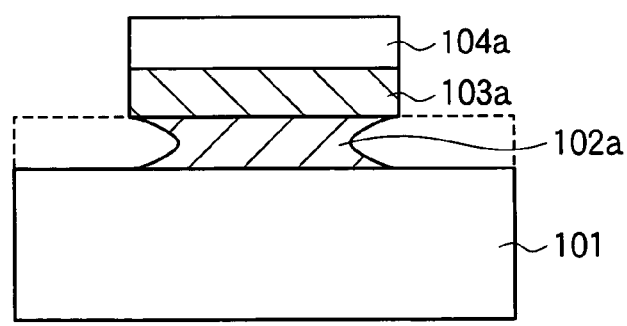
Figure 3D:
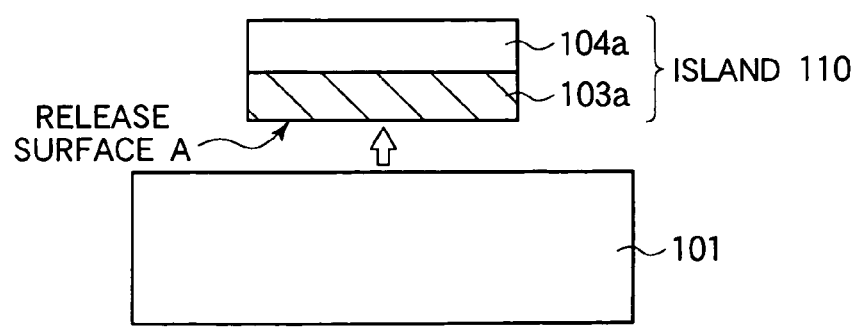

Then, the structure shown in FIG. 3B is subject to etching process so that the ZnO single crystal layer 102 is preferentially etched away as shown in FIG. 3C while the SiC substrate 101, nitride layer 103a and 3C—SiC layer 104a are not significantly etched.

In other words, the etching rate is higher in the ZnO single crystal layer 102 than in the SiC substrate 101, nitride layer 103a, and 3C—SiC 104a. The etching solution for this process may be an acid containing a chemical solution, for example, hydrofluoric acid (HF) or hydrochloric acid (HCl), or an alkaline etching solution containing a chemical solution, for example, potassium hydroxide (KOH) or tetra-methyl-ammonium-hydroxide (TMAH).

Etching the ZnO single crystal layer 102 away from the structure shown in FIG. 3B allows the structure formed of the nitride layer 103a and the 3C—SiC layer 104a to detach from the SiC substrate 101. This island-shaped structure detached from the SiC substrate 101 is an island 110. The exposed surface of the nitride layer 103a is a release surface "A" as shown is FIG. 3D.

Figure 5A:
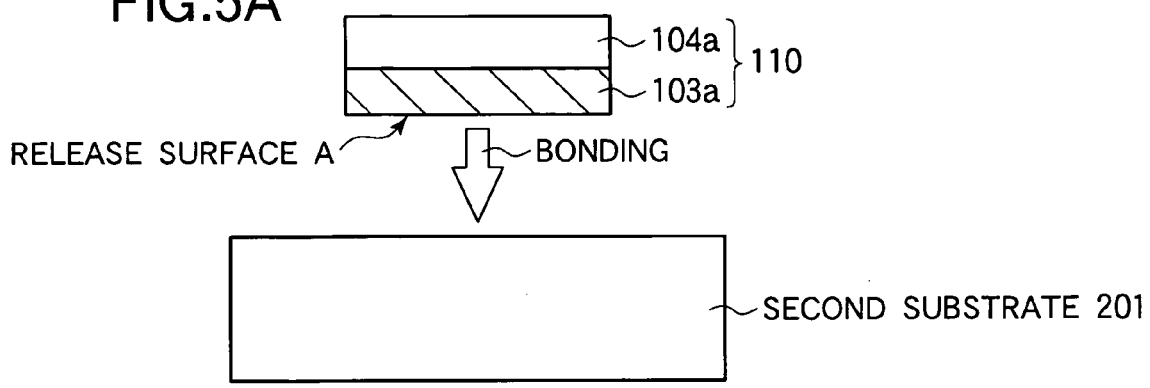
FIGS. 5A-5B illustrate the steps of bonding the island to a second substrate.
Figure 5B:
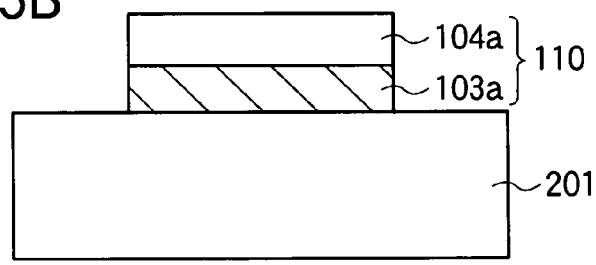

FIGS. 5A-5B illustrate the steps of bonding the island 110 to a second substrate.

The island 110 is bonded to a second substrate (i.e., substrate separate from the first substrate 101) 201 by pressing the island 110 against the second substrate 201 with the release surface "A" in contact with a surface of the second substrate 201 by intermolecular force. Prior to this bonding, the release surface "A" and the surface of the second substrate 201 are activated by, for example, plasma treatment. Bonding by intermolecular force is a bonding technique in which the surfaces are directly bonded without using an adhesive, solder, or paste so that the surfaces are bonded to each other by the gravity between the surfaces due to hydrogen bond, polarization, or induced charges.

Figure 6A:
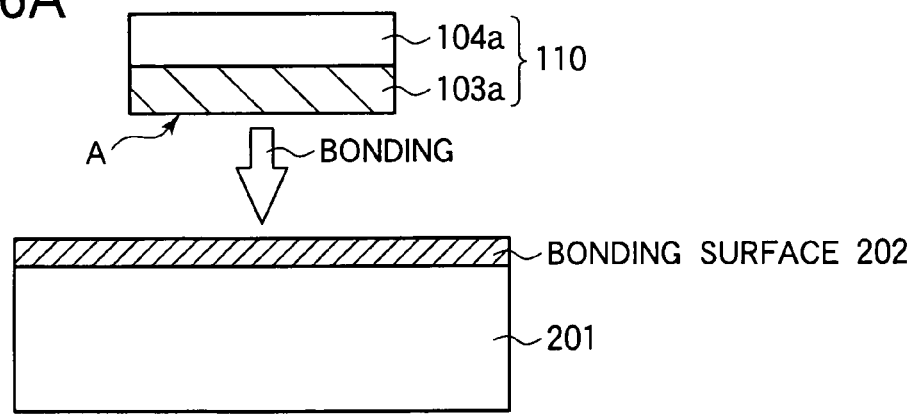
FIGS. 6A-6B illustrate the another way of bonding the island 110 to the second substrate.
Figure 6B:
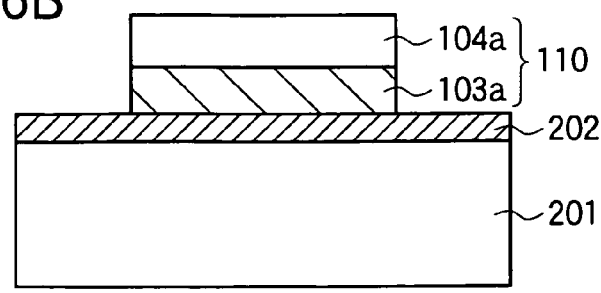

FIGS. 6A-6B illustrate the another way of bonding the island 110 to the second substrate.

The second substrate 201 may be a substrate less expensive as compared to a hexagonal SiC substrate. Such a substrate may be a semiconductor substrate excellent in heat conductivity, for example, a 3C—SiC single crystal substrate, an SiC polycrystalline substrate, or an Si substrate; a metal substrate excellent in heat conductivity formed of, for example, copper, aluminum, brass; or a dielectric substrate excellent in heat conductivity formed of, for example, $Al_2O_3$ (sapphire), AlN, or SiN. These materials improve heat dissipation efficiency of components region of the island 110. The second substrate 201 may also be a diamond substrate or a nano diamond substrate, which is expensive but highly heat conductive. A glass substrate or a plastic substrate may be used for some applications where heat dissipation is not of prime importance.

Alternatively, the island 110 may be bonded to a bonding layer 202 formed on the second substrate 201. The bonding layer 202 may be a metal layer formed of at least one element selected from the groups consisting of Au, Ge, Ni, Ti, Pt, Al, Pd, and Cu or an inorganic dielectric layer formed of a material, for example, $Al_2O_3$, AlN, SiN, SiON, $SiO_2$, or diamond like carbon.

The bonding layer 202 may be an organic layer in some applications where heat conductivity is not of prime importance. An organic layer having a thickness of equal to or smaller than, for example, 200 nm will greatly improve heat dissipation efficiency of the component region of the island 110 as compared to an organic layer having a thickness of equal to or larger than 1 μm.

As described above, intermolecular bonding is a preferable example. If the devices are to operate normally at temperatures higher than 150° C., intermolecular force ensures that the bonding is not damaged and remains reliable for Si devices or packages that carry general Si devices. "Damaged bonding" refers to cracks in the bonded thin film or detachment of the bonded thin film from the second substrate.

If the high temperature operation of the device is not prime importance, the island 110 may be bonded to the second substrate by other means instead of molecular force bonding. More specifically, the island 110 may be bonded by an adhesive layer, for example, adhesive or solder, by compounds resulting from mutual diffusion of elements at the bonded interface of a semiconductor and a metal, or by covalent bond between elements at the surfaces to be bonded.

Devices and/or wiring layers may be formed in the 3C—SiC layer 104a of the island 110 before the island 110 is bonded to the second substrate (separate substrate) 201.

Figure 7:
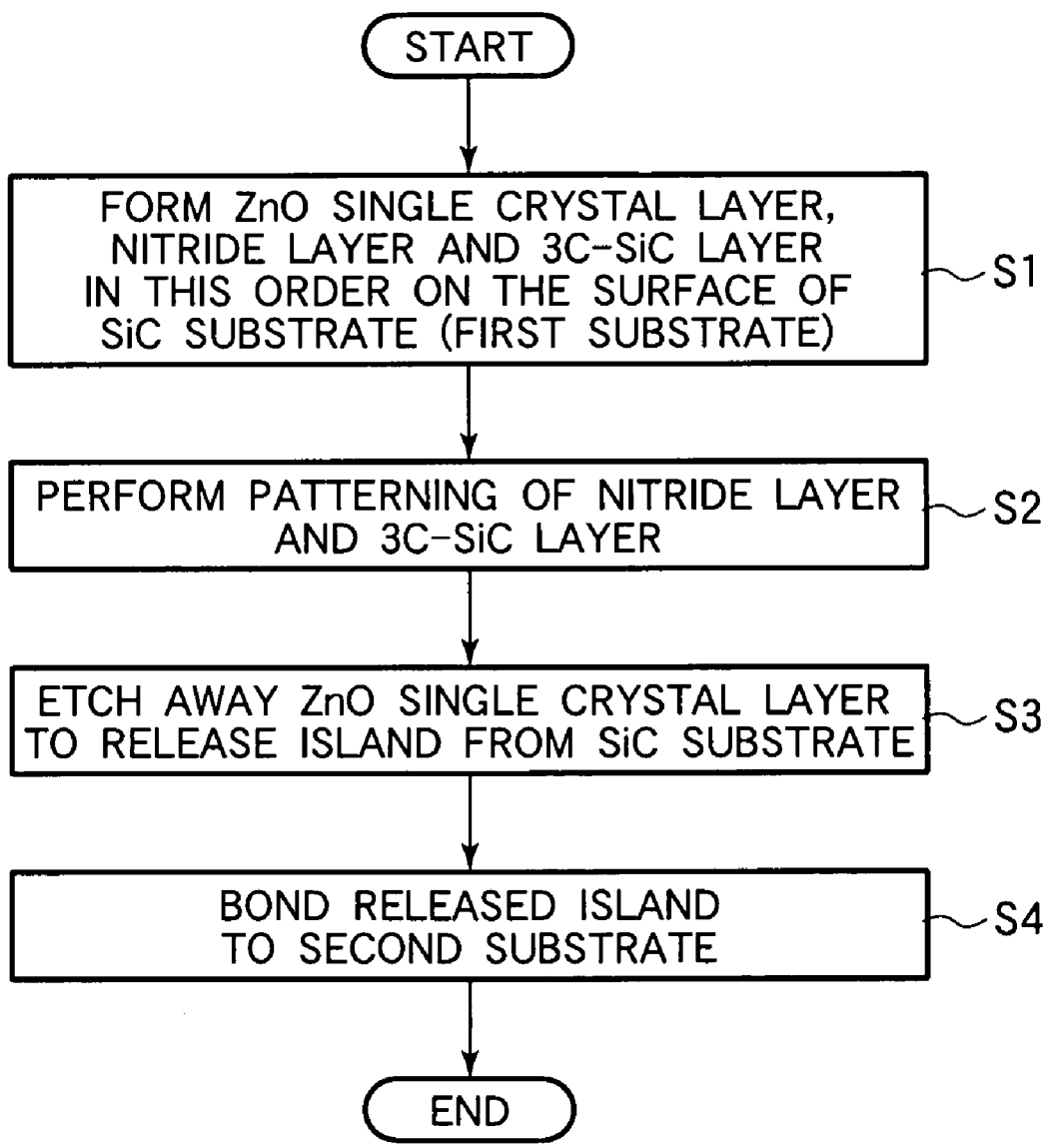
FIG. 7 is a flowchart illustrating the major manufacturing steps of the first embodiment.

FIG. 7 is a flowchart illustrating the major manufacturing steps of the first embodiment.

The manufacturing steps will be described with reference to FIG. 7. The ZnO single crystal layer 102, nitride layer 103, and 3C—SiC layer 104 are formed in this order on the surface of the SiC substrate 101 as a first substrate (step S1). At least the nitride layer 103 and 3C—SiC layer 104 are patterned (step S2). The ZnO single crystal layer 102 is etched away to release the island 110 from the SiC substrate (step S3). The released island 110 is bonded to the surface of the second substrate 201 separate from the first substrate 101, i.e., SiC substrate (step S4).

As described above, the method for manufacturing a semiconductor apparatus according to the first embodiment includes the following steps:

forming a ZnO single crystal layer on an SiC substrate as a first substrate;

forming a nitride layer on the surface of the ZnO single crystal layer, the nitride layer having a cubic semiconductor layer on its surface;

forming a 3C-siC layer on the surface of the nitride layer at a temperature equal to or lower than 1000° C.;

etching away the ZnO single crystal layer which serves as a sacrificial layer;

releasing an island formed of the nitride layer and the 3C—SiC layer from the SiC substrate;

bonding the island to a second substrate (separate form the first substrate) with the release surface of the island in intimate contact with the surface of the second substrate or the surface of a bonding layer formed on the second substrate.

The method according to the first embodiment provides the following advantages.

(1) An SiC single crystal substrate, which is of high quality and expensive, can be re-used.

(2) A high quality thin film of a 3C—SiC layer can be formed.

(3) A bonding may be achieved which withstands at temperatures higher than 150° C.

Second Embodiment

A second embodiment differs from the first embodiment in that a first substrate is a sapphire substrate instead of a hexagonal SiC single crystal substrate.

FIGS. 8A-8D illustrate the configuration of a structure according to the second embodiment in which crystal-grown layers are formed on a substrate. The second embodiment will be described with reference to FIGS. 8A-8D mainly in terms of portions different from the first embodiment.

Figure 8A:
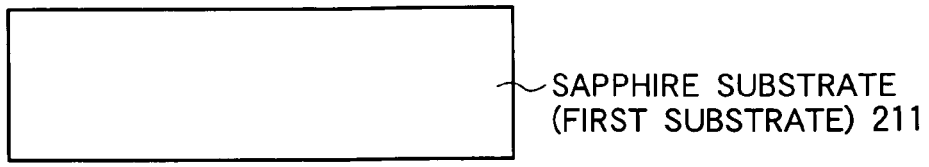
FIGS. 8A-8D illustrate the configuration of a structure according to the second embodiment in which crystal-grown layers are formed on a substrate.

FIG. 8A illustrates a first substrate of the second embodiment or a sapphire substrate 211. A sapphire substrate 211 is conveniently used with the surface of the sapphire substrate 211 lying in the (11-21) crystal plane. When the ZnO single crystal layer 102 is formed on the surface of the sapphire substrate 211, the lattice constant of the ZnO single crystal layer 102 substantially matches that of the sapphire substrate 211, preventing defects which would otherwise be caused by substantial mismatching of lattice constants.

Figure 8B:
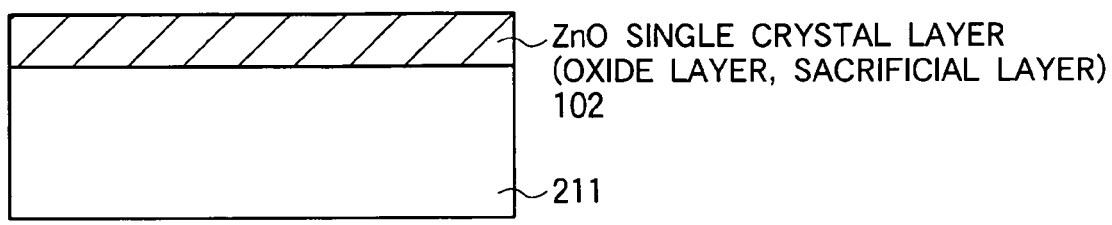

Referring to FIG. 8B, the ZnO single crystal layer 102 as a sacrificial layer is formed on the surface of the sapphire substrate 211. The crystal plane orientation of the sapphire substrate 211 may be selected for matching with that of the ZnO single crystal layer 102, thereby achieving the ZnO single crystal layer 102 of high quality. The manufacturing conditions (e.g., layer thickness) and processes used in the first embodiment may be applied to the formation of ZnO single crystal layer 102 of the second embodiment.

Figure 8C:
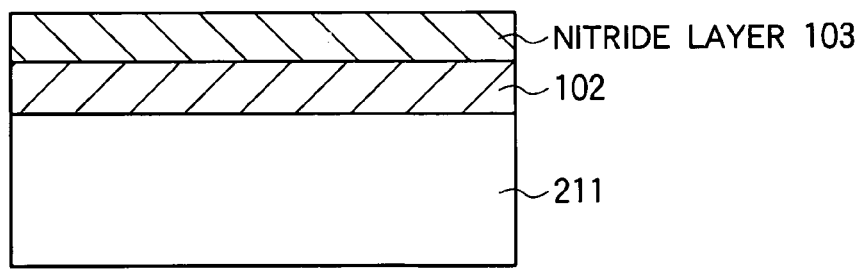

Referring to FIG. 8C, the nitride layer 103 is formed on the surface of the ZnO single crystal layer 102. When the ZnO single crystal layer 102 of the second embodiment is formed, the configuration of the nitride layer 103 and its manufacturing method used in the first embodiment may be used. The nitride layer 103 is preferably a cubic crystal semiconductor layer that has at least a surface of a cubic crystal structure. As described above, the ZnO single crystal layer 102 provides a high quality ZnO single crystal layer, allowing formation of the nitride layer 103 of high quality, which is a cubic crystal with less lattice defects, on the surface of the ZnO single crystal layer 102.

Figure 8D:
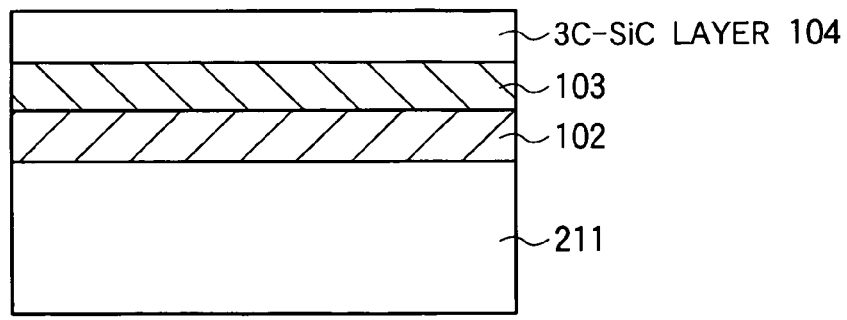

Referring to FIG. 8D, a 3C—SiC layer 104 is formed on the surface of the nitride layer 103. The configuration of the 3C—SiC layer 104 and the manufacturing method used in the first embodiment may be applied to the 3C—SiC layer 104 of the second embodiment.

The sapphire substrate 211 of the configuration including the crystal-grown layers formed through the aforementioned processes shown in FIGS. 8A-8D, is etched just as in the first embodiment so that the ZnO single crystal layer 102 as a sacrificial layer is removed, thereby releasing the structure consisting of a nitride layer 103a and a 3C—SiC layer 104a from the sapphire substrate 211. The thus released structure is an island 110.

The island 110 is bonded to a second substrate using the bonding process described in the first embodiment. A description of actual steps of bonding the island 110 is omitted.

Modification To Second Embodiment

The sapphire substrate 211 employed as the first substrate may be replaced by a nitride semiconductor substrate, for example, an $Al_xGa_{1-x}N$ ($1 \geq x \geq 0$) substrate, an $In_xGa_{1-x}$—N ($1 \geq x \geq 0$) substrate, or an $Al_xIn_{1-x}N$ ($1 \geq x \geq 0$) substrate. For a nitride semiconductor substrate, an $Al_xGa_{1-x}N$ ($1 \geq x \geq 0$) (e.g., an AlN layer or a GaN layer) layer may be formed as a buffer layer before a ZnO single crystal layer is formed on the nitride semiconductor substrate. Good lattice matching may be achieved between the nitride semiconductor substrate and the ZnO single crystal layer, allowing formation of a high quality ZnO single crystal layer with less lattice defect.

The second embodiment allows formation of a high quality 3C—SiC layer on an inexpensive sapphire substrate which serves as the first substrate. Of course, the sapphire substrate as the first substrate can be re-used.

Third Embodiment

A third embodiment will be described with reference to FIGS. 9-10. The third embodiment differs from the first and second embodiments in that a first substrate is a cubic crystal substrate instead of a substrate whose crystal structure substantially matches with a hexagonal semiconductor substrate. The third embodiment will be described with reference to FIGS. 9-10 in terms of portions different from the first and second embodiments.

FIGS. 9A-9E illustrate the steps of forming an island-shaped structure and releasing the island-shaped structure from a substrate.

Figure 9A:
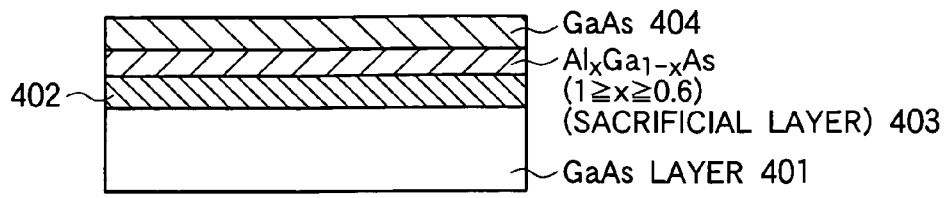
FIGS. 9A-9E illustrate the steps of forming an island-shaped structure and releasing the island-shaped structure from a substrate.

The manufacturing method of the third embodiment will be described with reference to FIGS. 9A-9D. Referring to FIG. 9A, a first substrate or a GaAs substrate 401 is employed as a cubic crystal substrate. A GaAs buffer layer 402, an $Al_xGa_{1-x}As$ ($1 \geq x \geq 0.6$) layer 403, and a GaAs layer 404 are formed in this order on the surface of the GaAs substrate 401. The $Al_xGa_{1-x}As$ ($1 \geq x \geq 0.6$) layer 403 serves as a sacrificial layer and is preferably 5-200 nm thick.

A thickness smaller than 5 nm causes slow penetration of etching solution into the layer 403 during the etching process in which the $Al_xGa_{1-x}As$ ($1 \geq x \geq 0$) layer 403 is preferentially etched, so that the etching rate decreases or etching process will apparently stop in the middle of the etching process. A thickness larger than 200 nm increases a surface area in contact with the etching solution to decrease the reaction speed, so that the etching rate decreases or etching process will apparently stop in the middle of the etching process.

Prolonged etching at slow etching rate may cause etched elements and reaction products to deposit, so that the selectively etched surfaces (the surface of the GaAs buffer layer 402 in contact with the $Al_xGa_{1-x}As$ ($1 \geq x \geq 0.6$) layer 403, and the surface of the GaAs layer 404 in contact with the $Al_xGa_{1-x}As$ ($1 \geq x \geq 0.6$) layer 403 are contaminated. Contamination of the selectively etched surface causes an increase in the surface roughness of the selectively etched surface observed under the AFM.

Figure 9B:
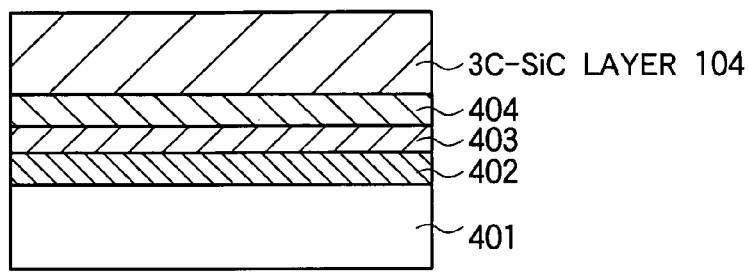

Referring to FIG. 9B, the 3C—SiC layer 104 is formed on the GaAs layer 404. The 3C—SiC layer 104 may be of the same configuration as the first embodiment, and the processes and conditions used in the first embodiment may be applied to the formation of the 3C—SiC layer 104.

Figure 9C:
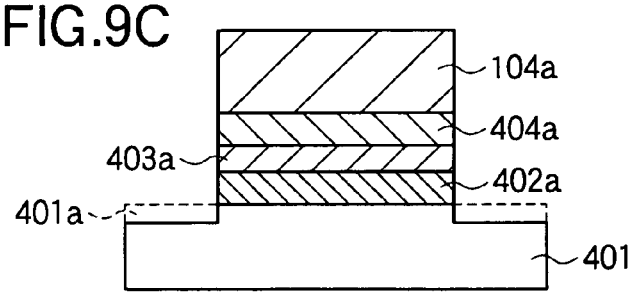

Referring to FIG. 9C, the structure shown in FIG. 9B is etched to form an island-shaped pattern of a predetermined size, the island-shaped pattern including a 3C—SiC layer 104a, a GaAs layer 404a, an $Al_xGa_{1-x}As$ ($1 \geq x \geq 0.6$) layer 403a, a GaAs buffer layer 402a, and a GaAs substrate 401a which is a part of the GaAs substrate 401 is etched away, the structure being etched so that at least the $Al_xGa_{1-x}As$ ($1 \geq x \geq 0.6$) is exposed. The island-shaped pattern may be etched by dry-etching or wet-etching. The island-shaped pattern includes a plurality of islands (only one of which is shown in the drawing).

Figure 9D:
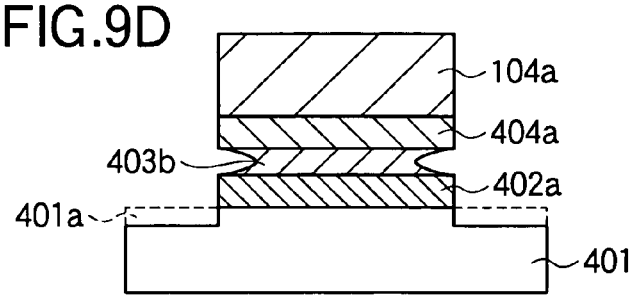

FIG. 9D illustrates the $Al_xGa_{1-x}As$ ($1 \geq x \geq 0.6$) layer 403b in the middle of etching process in which the $Al_xGa_{1-x}As$ ($1 \geq x \geq 0.6$) layer 403 is being preferentially etched away. The $Al_xGa_{1-x}As$ ($1 \geq x \geq 0.6$) layer 403a may be etched by wet-etching using an acid.

Figure 9E:
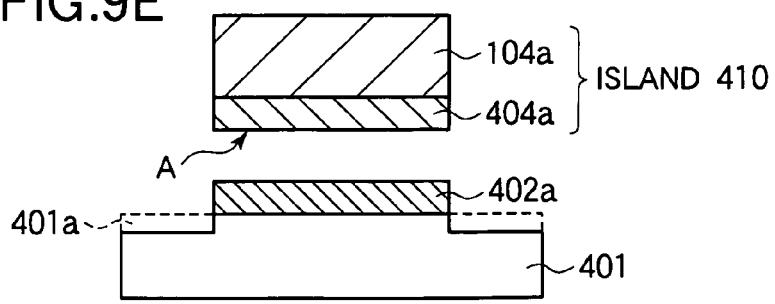

When the $Al_xGa_{1-x}As$ ($1 \geq x \geq 0.6$) layer 403b has been completely etched away (FIG. 9E), the island 410 including the 3C—SiC layer 104a and GaAs layer 404a is released from the GaAs buffer layer 402a (FIG. 9E)

The island 410 is bonded to the surface of a second substrate 201 (FIGS. 5 and 6) with a release surface "A" (FIG. 9E) in direct contact with the second substrate 201. This bonding process is the same as the first embodiment, and the detailed description is omitted.

The release surface "A" of the third embodiment is the surface of the GaAs layer 404a. The GaAs layer 404a can be easily controlled in conductivity type or doping level. Thus, if a bonding layer of metal is formed on the second substrate similar to that shown in FIG. 6, the GaAs layer 404a can form an ohmic contact with the metal layer. The metal layer may be formed of, for example, Ti, AuGeNi, or Ni/Ge, thereby implementing a low-resistance ohmic contact.

Figure 10:
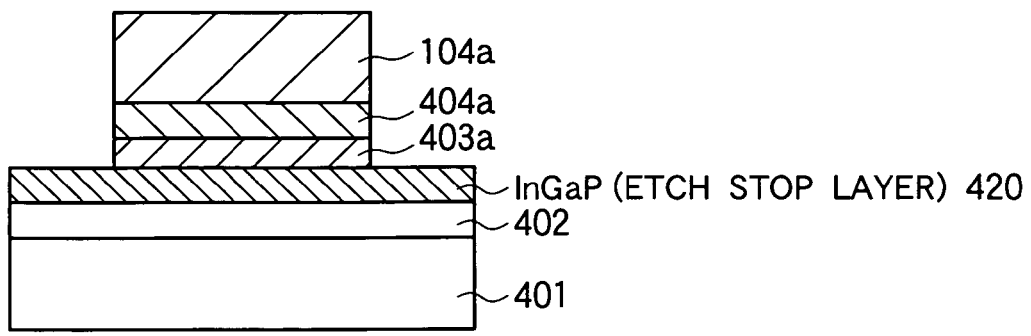
FIG. 10 illustrates a modification of crystal grown layers.
Figure 11:
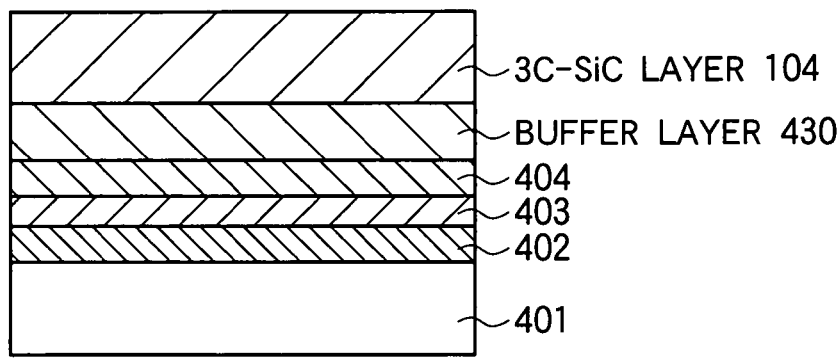
FIG. 11 illustrates another modification of crystal grown layers.
Figure 12:
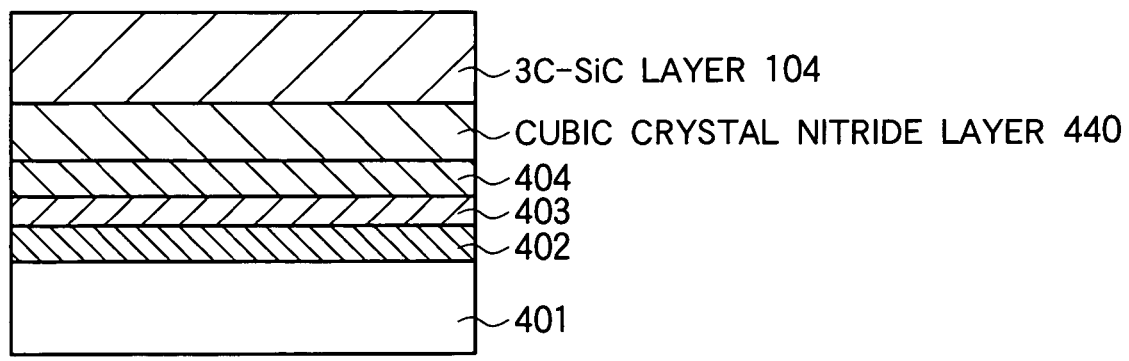
FIG. 12 illustrates yet another modification of crystal grown layers.

FIG. 10 illustrates a modification of crystal grown layers. FIG. 11 illustrates another modification of crystal grown layers. FIG. 12 illustrates yet another modification of crystal grown layers.

When the island-shaped pattern is formed, the structure shown in FIG. 9C does not necessarily need to be etched part way into the GaAs substrate 401. For example, an InGaP layer 420 may be formed as an etch stop layer, so that the surface treatment of the GaAs substrate 401 for re-use may be simplified.

Instead of forming the 3C—SiC layer 104 directly on the GaAS layer 404, a buffer layer 430 (FIG. 11) may be formed between the GaAs layer 404 and the 3C—SiC layer 104. The buffer layer 430 may be formed of, for example, an amorphous Si layer, a polycrystalline Si layer, an amorphous SiC layer, or a polycrystalline SiC layer. Still alternatively, a cubic crystal nitride layer 440 (e.g., a cubic $Al_xGa_{1-x}N$ layer may be formed on the GaAs layer 404 as shown in FIG. 12.

The method for manufacturing a semiconductor apparatus according to the third embodiment includes the following steps:

forming the GaAs buffer layer 402, the $Al_xGa_{1-x}As$ layer 403, the GaAs layer 404, and the 3C—SiC layer 104 on the GaAs substrate 401 in this order, thereby forming a multilayer structure;

patterning the multilayer structure by etching to form a multilayer island;

etching the multilayer island to etch away the $Al_xGa_{1-x}As$ layer 403 which is a sacrificial layer, thereby releasing an island 410 formed of the GaAs layer 404a and the 3C—SiC layer 104a from the GaAs buffer layer 402a; and bonding the island 410 to the second substrate with the exposed surface of the GaAs layer 404a of the island 410 in contact with the second substrate.

Thus, the third embodiment provides the same advantages as the first and second embodiments. Further, controlling the carrier concentration in the GaAs layer 404a ensures that if the bonding layer of metal is formed on the second substrate 201 is a metal layer, the GaAs layer 404a is bonded to the bonding layer of the second substrate with a low-resistance ohmic contact regardless of the conductivity type (i.e., p type or n type) of the GaAs layer 404a.

If the contact resistance between the GaAs layer 404a and the bonding layer formed of metal is lower than the resistance of the GaAs layer 404a between two opposing principal surfaces of the GaAs layer 404a, then the GaAs layer 404a may be bonded to the second substrate 201 with a "low-resistance ohmic contact." Another way of saying "low-resistance ohmic contact" is that the voltage drop across the bonded portion between the GaAs layer 404a and the bonding layer is lower than that across the two opposing principal surfaces of GaAs layer 404a.

The GaAs layer 404a, which is controllable in doping level, may be an $Al_xGa_{1-x}As$ layer. The composition ratio "t" of Al is preferably selected to be such that x>t where "x" is the composition ratio of $Al_xGa_{1-x}As$ ($1 \geq x \geq 0.6$) layer 403a. In other words, the GaAs layer 404a may be an $Al_xGa_{1-x}As$ ($0.6 > x \geq 0$) layer.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A method for manufacturing a cubic silicon carbide single crystal thin film, the method comprising:

forming a sacrificial layer on a surface of a substrate;

forming a cubic semiconductor layer on a surface of the sacrificial layer, the cubic semiconductor layer having at least a surface of cubic crystal structure;

forming a cubic silicon carbide single crystal layer on the surface of the cubic semiconductor layer; and etching away the sacrificial layer to release a multilayer structure formed of the cubic semiconductor layer and the cubic silicon carbide single crystal layer from the substrate.

2. The method according to claim 1, wherein the substrate is a first substrate, the method further comprising bonding the multilayer structure to a second substrate with an exposed surface of the cubic semiconductor layer in contact with the second substrate.

3. The method according to claim 2, wherein the sacrificial layer is a ZnO single crystal layer;

the first substrate is a substrate selected from the group consisting of an SiC substrate, a sapphire substrate, an $Al_xGa_{1-x}N$ ($1 \geq x \geq 0$) substrate, an $In_xGa_{1-x}N$ ($1 \geq x \geq 0$) substrate, and an $Al_xIn_{1-x}N$ ($1 \geq x \geq 0$) substrate; and the cubic semiconductor layer is a nitride layer selected from the group consisting of an $Al_xGa_{1-x}N$ ($1 \geq x \geq 0$) layer, an $In_xGa_{1-x}N$ ($1 \geq x \geq 0$) layer, and an $Al_xIn_{1-x}N$ ($1 \geq x \geq 0$) layer.

4. The method according to claim 2, wherein the sacrificial layer is an $Al_xGa_{1-x}As$ ($1 \geq x \geq 0.6$) layer, the first substrate is a GaAs substrate, and the cubic semiconductor layer is an $Al_xGa_{1-x}As$ ($0.6 > x \geq 0$) layer.

5. The method according to claim 1, wherein the sacrificial layer is a ZnO single crystal layer;

the substrate is a substrate selected from the group consisting of an SiC substrate, a sapphire substrate, an $Al_xGa_{1-x}N$ ($1 \geq x \geq 0$) substrate, an $In_xGa_{1-x}N$ ($1 \geq x \geq 0$) substrate, and an $Al_xIn_{1-x}N$ ($1 \geq x \geq 0$) substrate; and the cubic semiconductor layer is a nitride layer selected from the group consisting of an $Al_xGa_{1-x}N$ ($1 \geq x \geq 0$) layer, an $In_xGa_{1-x}N$ ($1 \geq x \geq 0$) layer, and an $Al_xIn_{1-x}N$ ($1 \geq x \geq 0$) layer.

6. The method according to claim 1, wherein the sacrificial layer is an $Al_xGa_{1-x}As$ ($1 \geq x \geq 0.6$) layer, the substrate is a GaAs substrate, and the cubic semiconductor layer is an $Al_xGa_{1-x}As$ ($0.6 > x \geq 0$) layer.

7. The method according to claim 6, wherein the substrate is a first substrate, the method further comprising:

forming a metal layer on a second substrate; and bonding the multilayer structure to a second substrate with an exposed surface of the $Al_xGa_{1-x}As$ ($0.6 > x \geq 0$) layer in direct contact with the metal layer.

8. The method according to claim 7, wherein the contact resistance between the $Al_xGa_{1-x}As$ ($0.6 > x \geq 0$) layer and the metal layer is lower than the resistance of the $Al_xGa_{1-x}As$ ($0.6 > x \geq 0$) between two opposing principal surfaces of the $Al_xGa_{1-x}As$ ($0.6 > x \geq 0$).

* * * * *